United States Patent
Uehara

(10) Patent No.: US 12,152,297 B2
(45) Date of Patent: Nov. 26, 2024

(54) SUBSTRATE ROTATING APPARATUS

(71) Applicant: santec Holdings Corporation, Komaki (JP)

(72) Inventor: Noboru Uehara, Komaki (JP)

(73) Assignee: santec Holdings Corporation, Komaki (JP)

(*) Notice: Subject to any disclaimer, the term of this patent is extended or adjusted under 35 U.S.C. 154(b) by 0 days.

(21) Appl. No.: 17/768,060

(22) PCT Filed: Mar. 31, 2020

(86) PCT No.: PCT/JP2020/014868
§ 371 (c)(1),
(2) Date: Apr. 11, 2022

(87) PCT Pub. No.: WO2021/075074
PCT Pub. Date: Apr. 22, 2021

(65) Prior Publication Data
US 2024/0093358 A1    Mar. 21, 2024

(30) Foreign Application Priority Data
Oct. 15, 2019   (JP) .................... 2019-188681

(51) Int. Cl.
*C23C 16/50*   (2006.01)
*C23C 14/50*   (2006.01)
(Continued)

(52) U.S. Cl.
CPC .......... *C23C 14/505* (2013.01); *C23C 14/547* (2013.01); *H01L 21/68764* (2013.01)

(58) Field of Classification Search
CPC ............. C23C 14/505; C23C 14/547; H01L 21/68764
See application file for complete search history.

(56) References Cited

U.S. PATENT DOCUMENTS 3,128,205 A * 4/1964 Illsley .................. C23C 14/505
                                                    118/730
4,501,766 A   2/1985 Suzuki et al.
(Continued)

FOREIGN PATENT DOCUMENTS

DE     4025659 A1    2/1992
JP    58132755 A     8/1983
(Continued)

OTHER PUBLICATIONS

Notification of Transmittal of Translation of the International Preliminary Report on Patentability issued on Apr. 28, 2022 in PCT/JP2020/014868. 1 page.
(Continued)

*Primary Examiner* — Yuechuan Yu
(74) *Attorney, Agent, or Firm* — Meunier Carlin & Curfman LLC

(57) ABSTRACT

A substrate rotating apparatus comprises a main rotation mechanism, an auxiliary rotation mechanism, and a guide structure. The main rotation mechanism rotates around a first rotation shaft. The main rotation mechanism comprises the auxiliary rotation mechanism. The auxiliary rotation mechanism revolves about the first rotation shaft in accordance of rotation of the main rotation mechanism, and rotates around a second rotation shaft. The second rotation shaft is displaced in a radial direction with respect to the first rotation shaft. The guide structure has a contact surface extending in a circumferential direction with respect to the first rotation shaft. The guide structure controls displacement of the second rotation shaft in the radial direction, and causes the auxiliary rotation mechanism to perform the revolving motion in an orbit along the contact surface when the contact surface and the auxiliary rotation mechanism are in contact with each other.

16 Claims, 10 Drawing Sheets

(51) Int. Cl.
*C23C 14/54* (2006.01)
*H01L 21/687* (2006.01)

(56) References Cited

U.S. PATENT DOCUMENTS

| | | | |
|---|---|---|---|
| 5,002,011 A * | 3/1991 | Ohmine | C23C 16/4588 118/725 |
| 5,106,346 A | 4/1992 | Locher | |
| 6,457,864 B1 * | 10/2002 | Chang | H02N 2/0095 384/247 |

FOREIGN PATENT DOCUMENTS

| JP | 688227 A | 3/1994 |
|---|---|---|
| JP | H0688227 A | 3/1994 |
| JP | H06192835 A | 7/1994 |
| JP | 2006330656 A * | 12/2006 |
| KR | 1020110072905 A | 6/2011 |

OTHER PUBLICATIONS

International Preliminary Report on Patentability issued on Apr. 19, 2022 in PCT/JP2020/014868. 1 page.
Written Opinion of the International Searching Authority issued on Jun. 23, 2020 in PCT/JP2020/014868. 3 pages.
Chinese Office Action, Application No. 202080071635.4, issued Apr. 27, 2023.
International Search Report in Application No. PCT/JP2020/014868, mailed Jun. 23, 2020, 5 pages.
Office Action issued in German application No. 11 2020 005 064.5, dated, Apr. 24, 2024, 12 pages.
Office Action issued in Korean Application No. 10-2022-7013902, dated Apr. 15, 2022, 12 pages.

* cited by examiner

SUBSTRATE ROTATING APPARATUS

CROSS-REFERENCE TO RELATED APPLICATION

This application is a national stage application filed under 35 U.S.C. § 371 of PCT/JP2020/014868 filed on Mar. 31, 2020, which claims the benefit of Japanese Patent Application No. 2019-188681 filed on Oct. 15, 2019 with the Japan Patent Office, the content of which is incorporated herein by reference in its entirety.

TECHNICAL FIELD

The present disclosure relates to a substrate rotating apparatus for film formation.

BACKGROUND ART

To form thin films with uniform thickness on two or more lenses, there is already known a thin film vapor deposition device including a lens holder rotatably holding each of the two or more lenses (see, for example, Patent Document 1). When the lens holder rotates in this thin film vapor deposition device, the lenses are rotated on the lens holder by a planetary gear mechanism. Accordingly, the lenses revolve in accordance with rotation of the lens holder, while rotating on their own axes.

PRIOR ART DOCUMENTS

Patent Documents

Patent Document 1: Japanese Unexamined Patent Application Publication No. H06-192835

SUMMARY OF THE INVENTION

Problems to be Solved by the Invention

Film forming devices used in optical and semiconductor fields usually form a uniform thin film on a substrate. If a thin film with a uniform film thickness can be formed on a large substrate, costs related to film formation can be reduced, and the productivity of product can be increased. However, a film material to be emitted as scattered particles from a film material source such as a vapor deposition source has a non-uniform spatial distribution for a substrate. The non-uniformity becomes worse as an attempt is made to form a thin film on a large area of the substrate.

To address it, the non-uniform thickness of the thin film formed on the substrate has been conventionally made uniform by using a film thickness correction plate to make the film thickness equal. However, the method for making a film thickness equal using a film thickness correction plate requires to accurately mount the film thickness correction plate on the substrate, and further to remake the film thickness correction plate in accordance with a spatial distribution of scattered particles.

As in Cited Reference 1, by a technique of revolving and rotating, during film formation, a substrate such as a lens, which is an object of the film formation, it is also possible to form a substantially uniform thin film on the substrate while inhibiting influence of the uneven spatial distribution of the scattered particles. However, this technique leaves room for improvement in the uniformity of the thin film.

Thus, according to some embodiments of the present disclosure, it is preferable that a technique is provided suitable for forming on a substrate a film with more uniform thickness than that of conventional one.

Means for Solving the Problems

According to some embodiments, a substrate rotating apparatus for film formation is provided. The substrate rotating apparatus comprises a main rotation mechanism, an auxiliary rotation mechanism, and a guide structure. The main rotation mechanism rotates around a first rotation shaft.

The main rotation mechanism comprises the auxiliary rotation mechanism. The auxiliary rotation mechanism revolves about the first rotation shaft in accordance of rotation of the main rotation mechanism, and rotates around a second rotation shaft. The auxiliary rotation mechanism comprises a support structure supporting a substrate as an object of the film formation. The support structure rotates around the second rotation shaft. The second rotation shaft is displaced in a radial direction with respect to the first rotation shaft.

The guide structure is provided around the first rotation shaft and configured to control a revolving motion of the auxiliary rotation mechanism. The guide structure has a contact surface extending in a circumferential direction with respect to the first rotation shaft. The guide structure controls displacement of the second rotation shaft in the radial direction, and causes the auxiliary rotation mechanism to perform the revolving motion in an orbit along the contact surface when the contact surface and the auxiliary rotation mechanism are in contact with each other.

As in conventional methods, in a method of revolving and rotating on its own axis a support structure for a substrate as an object for film formation by using a planetary gear mechanism, a revolving orbit is a perfectly circular orbit. A disclosing party of the present disclosure has noticed that such circular orbit hinders a high-precise formation of a film with a uniform film thickness on a substrate.

In the substrate rotating apparatus according to some embodiments described above, since the guide structure enables control of the revolving orbit of the support structure, the revolving orbit is not limited to a perfectly circular orbit, unlike the planetary gear mechanism with the revolving orbit of the support structure being limited to a shape corresponding to a gear. That is, the substrate rotating apparatus according to some embodiments can achieve the revolving orbit other than the perfectly circular orbit by the guide structure having a shape other than a perfect circle.

Accordingly, some embodiments allow greater design freedom for the support structure and a rotational motion of the substrate. This design freedom enables all points on the substrate as an object of the film formation to be displaced with respect to a spatial distribution of the film material such that a non-uniformity of the aforementioned spatial distribution is cancelled out. Therefore, some embodiments can provide the substrate rotating apparatus for film formation that enables a uniform thin film to be formed with high precision on the substrate.

According to some embodiments, the contact surface may be an inner circumferential surface facing the first rotation shaft included in the guide structure. The inner circumferential surface may control displacement of the auxiliary rotation mechanism to an outer side in the radial direction.

On the auxiliary rotation mechanism, a centrifugal force acts in a rotational system of the main rotation mechanism in a radially outward direction. That is, the auxiliary rotation mechanism attempts to displace itself to the radially outward direction. By contact with the auxiliary rotation mechanism on the inner circumferential surface of the guide structure, displacement due to the centrifugal force is regulated, thereby enabling the auxiliary rotation mechanism to be stably revolved in the orbit along the inner circumferential surface of the guide structure. This allows the revolving motion of the support structure to be controlled with high precision. This highly accurate control contributes to formation of the film with the uniform film thickness.

According to some embodiments, the main rotation mechanism may include a rotation plate rotating around the first rotation shaft. The rotation plate may have a slit in the radial direction. The auxiliary rotation mechanism may include the second rotation shaft penetrating the slit.

The auxiliary rotation mechanism may include a rotating table including the support structure in a first end portion of the second rotation shaft. The auxiliary rotation mechanism may include a wheel in a second end portion opposite to the first end portion of the second rotation shaft, and the wheel travels on the contact surface of the guide structure. While the wheel travels on the contact surface in accordance with the revolving motion, the wheel and the rotating table that is coupled via the second rotation shaft may rotate on their own axes revolving motion.

The substrate rotating apparatus as described above can achieve revolution and rotation along the guide structure of the auxiliary rotation mechanism by a relatively simple mechanical structure.

According to some embodiments, the auxiliary rotation mechanism may be coupled to the main rotation mechanism via a spring biasing the auxiliary rotation mechanism in a direction to press on the contact surface. Such biasing enables the auxiliary rotation mechanism to stably and accurately revolve along the contact surface of the guide structure. As a result, the uniformity of the film thickness is improved.

According to some embodiments, the substrate rotating apparatus may be configured such that the auxiliary rotation mechanism performs a revolving motion about the first rotation shaft in an elliptical orbit. According to some embodiments, the contact surface of the guide structure may be arranged in an elliptical shape in a circumferential direction.

According to some embodiments, the contact surface of the guide structure may be arranged in a ring shape that does not have point symmetry in the circumferential direction. The auxiliary rotation mechanism may perform the revolving motion about the first rotation shaft in an orbit having no point symmetry. Such a revolving orbit is advantageous to the formation of a film with the uniform film thickness. This is because the spatial distribution of the film material exhibits, in many cases, a distribution having point symmetry.

According to some embodiments, the guide structure may comprise a sliding mechanism for moving at least part of the contact surface to the radial direction. In the substrate rotating apparatus including the sliding mechanism, a user can adjust the revolving orbit via the sliding mechanism, enabling the film having the uniform film thickness to be formed on the substrate with higher precision.

EXPLANATION OF REFERENCE NUMERALS

1 . . . dielectric film vapor deposition device, 10 . . . vapor deposition source, 15 . . . container, 100 . . . substrate rotating apparatus, 110 . . . motor, 130 . . . guiding device, 131 . . . base plate, 133 . . . ball bearing, 135 . . . shaft, 137 . . . guide member, 137A . . . guide rail, 137B . . . inner circumferential surface, 137C . . . bottom plate, 137D . . . hole, 139A . . . guide rail, 141 . . . first sliding mechanism, 142 . . . second sliding mechanism, 150 . . . main-rotation device, 151 . . . main-rotation plate, 155 . . . shaft, 159 . . . slit, 170 . . . auxiliary rotation device, 171 . . . rotating table, 171A . . . recess, 171B . . . cavity, 175 . . . shaft, 179 . . . wheel, 179A . . . wheel-body, 179B . . . O-ring, 180 . . . single-shaft sliding stage, 181 . . . stage body, 181A . . . ball bearing, 185 . . . spring structure, 185A . . . spring, 185B . . . spring-fixing portion, 190 . . . substrate rotating apparatus, 200 . . . substrate, RS . . . light receiving sensor.

MODE FOR CARRYING OUT THE INVENTION

The following will describe some embodiments with reference to accompanying the drawings.

A substrate rotating apparatus 100 in some embodiments is the substrate rotating apparatus 100 for film formation used in dielectric film vapor deposition or crystal growth. In order to assist in forming a uniform thin film on a substrate 200, the substrate rotating apparatus 100 receives power from a motor 110 to revolve and rotate on its own axis the substrate 200 as an object of the film formation.

Examples of the substrate 200 include not only optical substrates, but also substrates for manufacturing semiconductor devices. The thin film formation on the optical substrates is carried out, for example, in order to provide specified optical properties to the optical substrates. Examples of the optical substrates include not only flat substrates, but also substrates having a concave surface or a convex surface.

Figure 1:
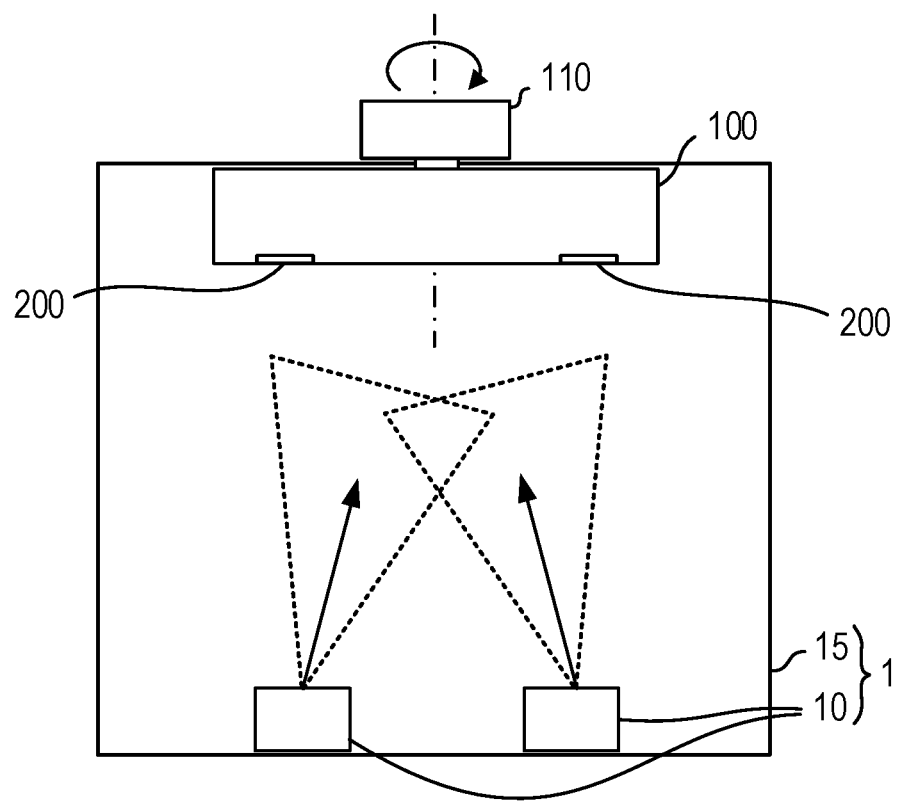
FIG. 1 is a conceptual diagram of a dielectric film vapor deposition device comprising a substrate rotating apparatus in some embodiments.

For example, as shown in FIG. 1, the substrate rotating apparatus 100 is arranged within a container 15 of a dielectric film vapor deposition device 1 including two or more vapor deposition sources 10. In the substrate rotating apparatus 100, a surface of the substrate 200 as an object of the film formation faces the vapor deposition sources 10.

The substrate rotating apparatus 100 receives power from the motor 110, thereby to revolve and rotate on its own axis the substrate 200 within the container 15. The container 15 is maintained in a vacuum state. In this state, a film material is vaporized from the vapor deposition source 10, and the vaporized film material scatters as scattered particles within the container 15. In FIG. 1, broken lines conceptually illustrate a spread of the scattered particles, and arrows conceptually illustrate directions where the scattered particles flow.

The scattered particles are attached on the substrate 200, thereby to form a thin film on the substrate 200. When different kinds of thin films are layered on the substrate 200, the two or more vapor deposition sources 10 operate in order. When operating, each of the vapor deposition sources 10 vaporizes and scatters a corresponding kind of film material such that a corresponding kind of thin film is formed on the substrate 200.

A spatial distribution of the film material scattered from each of the vapor deposition sources 10 to the substrate 200 has a geometric shape having substantially point symmetry. As the film materials are closer to the center, the amount of the film materials scattered is greater. As the film materials are farther from the center, the amount of the film materials scattered is smaller.

Accordingly, a film thickness $\lambda$ of the thin film formed on the substrate 200 usually indicates a distribution in accordance with a function $\lambda = T(r) = T0 + k1 \cdot r + k2 \cdot r^2 + k3 \cdot r^3 + \ldots$, that is, the distribution in accordance a univariate polynomial having a distance r distancing from the center as a single variable. In the case where the thin film formation is performed in a state where the substrate 200 does not rotate and is stationed, the coefficients k1, k2, k3, . . . are in accordance with a scattering distribution of the film material.

In the substrate rotating apparatus 100 in some embodiments, the substrate 200 is revolved and rotated on its own axis, whereby all points on the substrate 200 are displaced with respect to the scattering distribution of the film material. This makes the coefficients k1, k2, k3 . . . closer to zero, so that a distribution T(r) of the film thickness h expresses only a constant term T0, thereby expressing the film thickness $\lambda$ having uniformity regardless of the distance r, and thus a homogeneous thin film is formed with respect to a large area of the substrate 200.

The substrate rotating apparatus 100 achieves formation of a more uniform thin film than that of conventional one by achieving a revolving orbit that has no point symmetry and that is not a perfect circle, such as an ellipse. For this revolving orbit, the substrate rotating apparatus 100 is configured as shown in FIG. 2.

Figure 2:
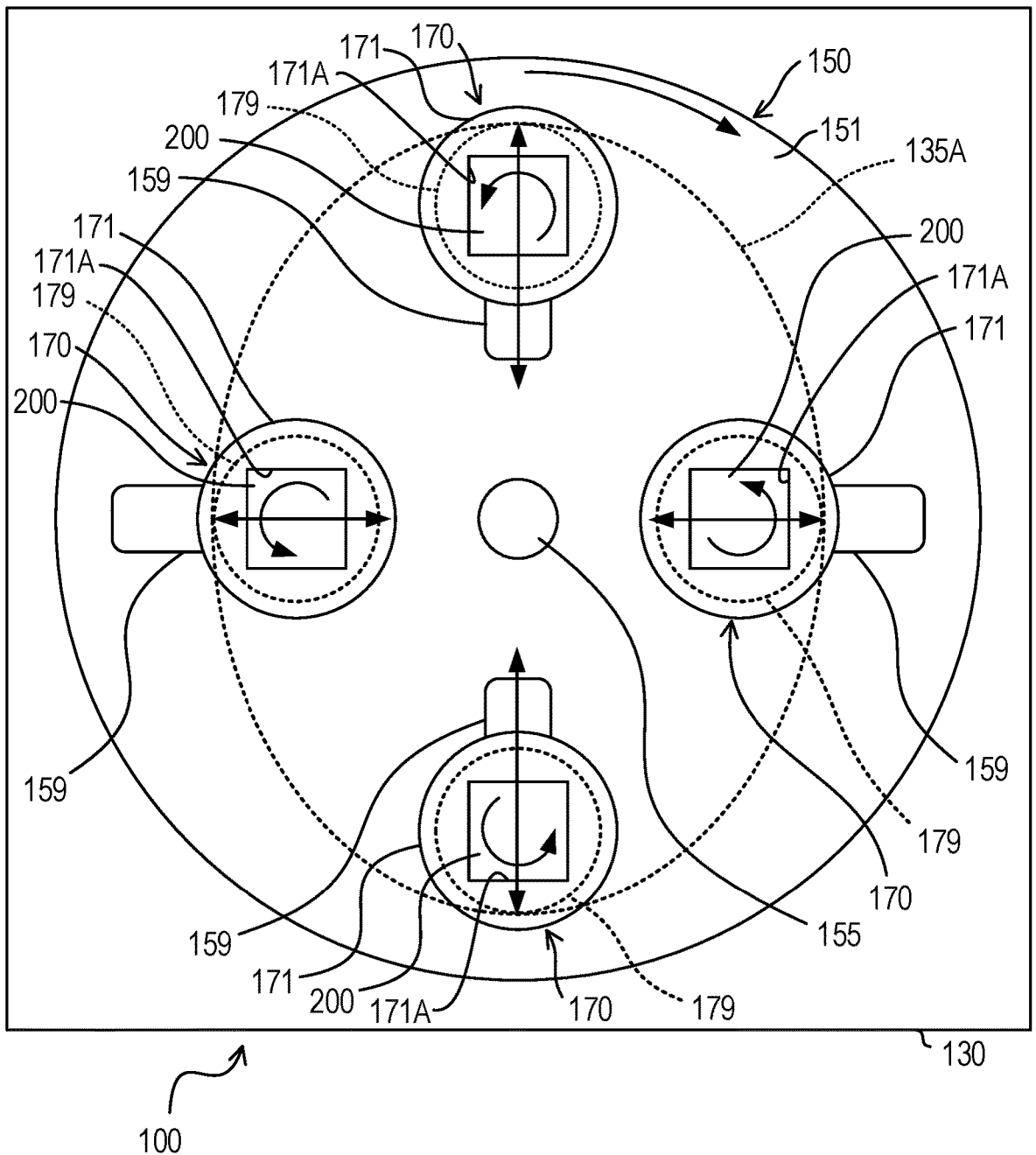
FIG. 2 is a schematic plan view of the substrate rotating apparatus in some embodiments.

The substrate rotating apparatus 100 shown in FIG. 2 comprises a guiding device 130, a main-rotation device 150 mounted on the guiding device 130, and two or more auxiliary rotation devices 170 mounted on the main-rotation device 150.

Broken lines in FIG. 2 indicate a part located on a back side with respect to a front surface of the substrate rotating apparatus 100 in a transparent manner. Arrows in FIG. 2 indicate that the main-rotation device 150 performs a rotational motion and a part of each auxiliary rotation device 170 performs a rotational motion and a linear motion.

Figure 3:
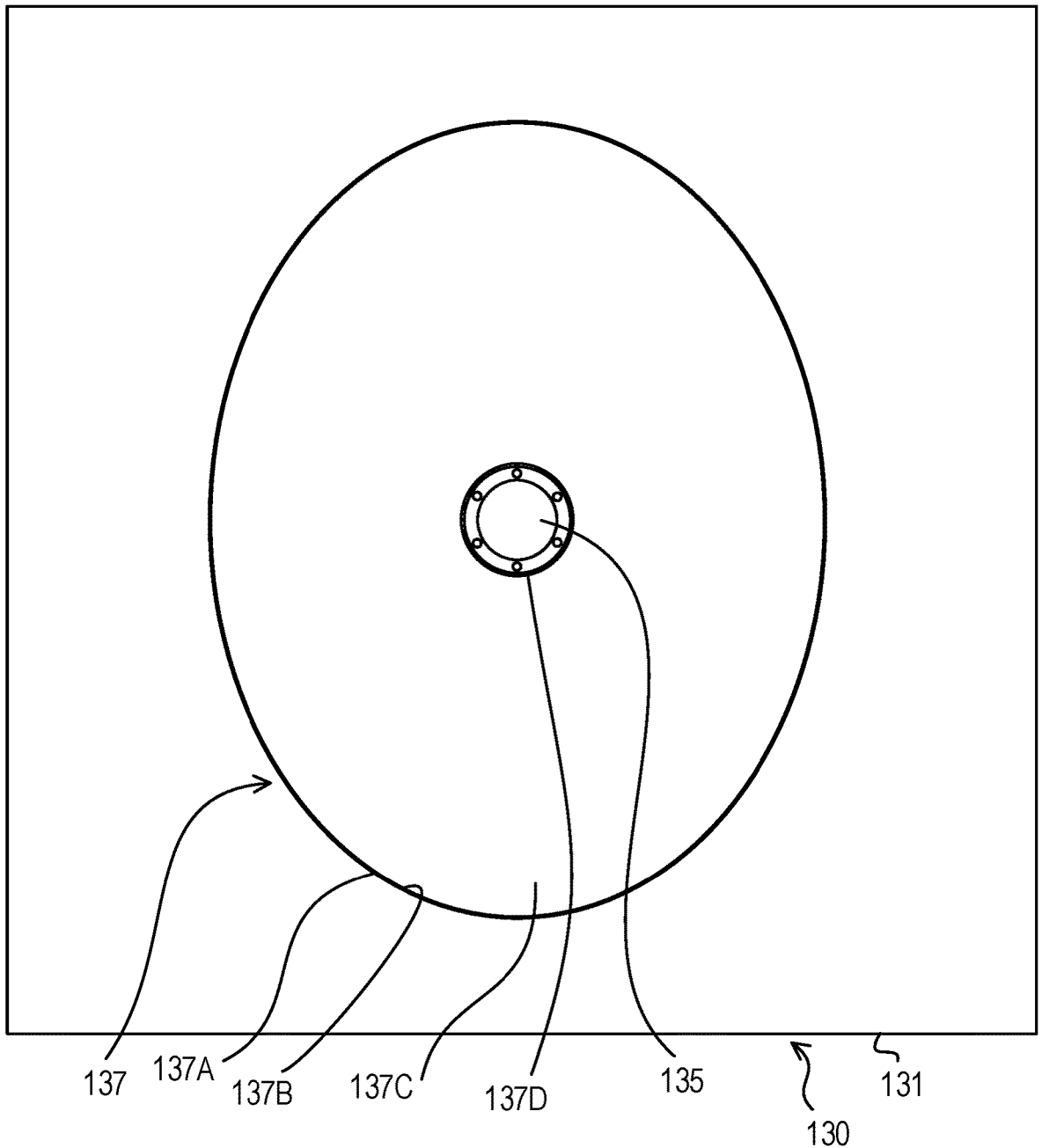
FIG. 3 is a schematic plan view of a guiding device in some embodiments.
Figure 4:
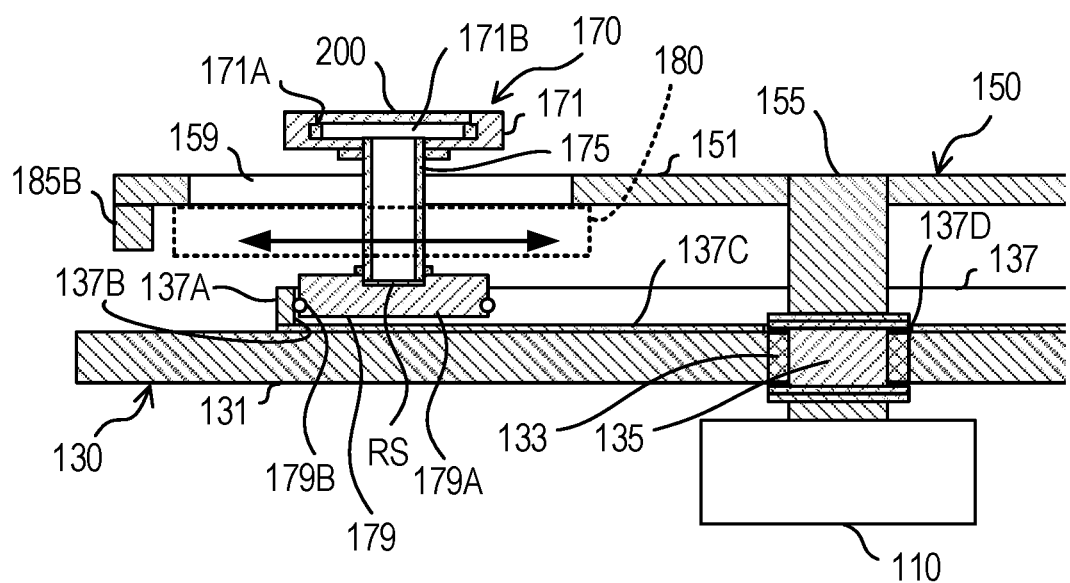
FIG. 4 is a schematic sectional view of the substrate rotating apparatus taking along rotation shafts in some embodiments.
Figure 5:
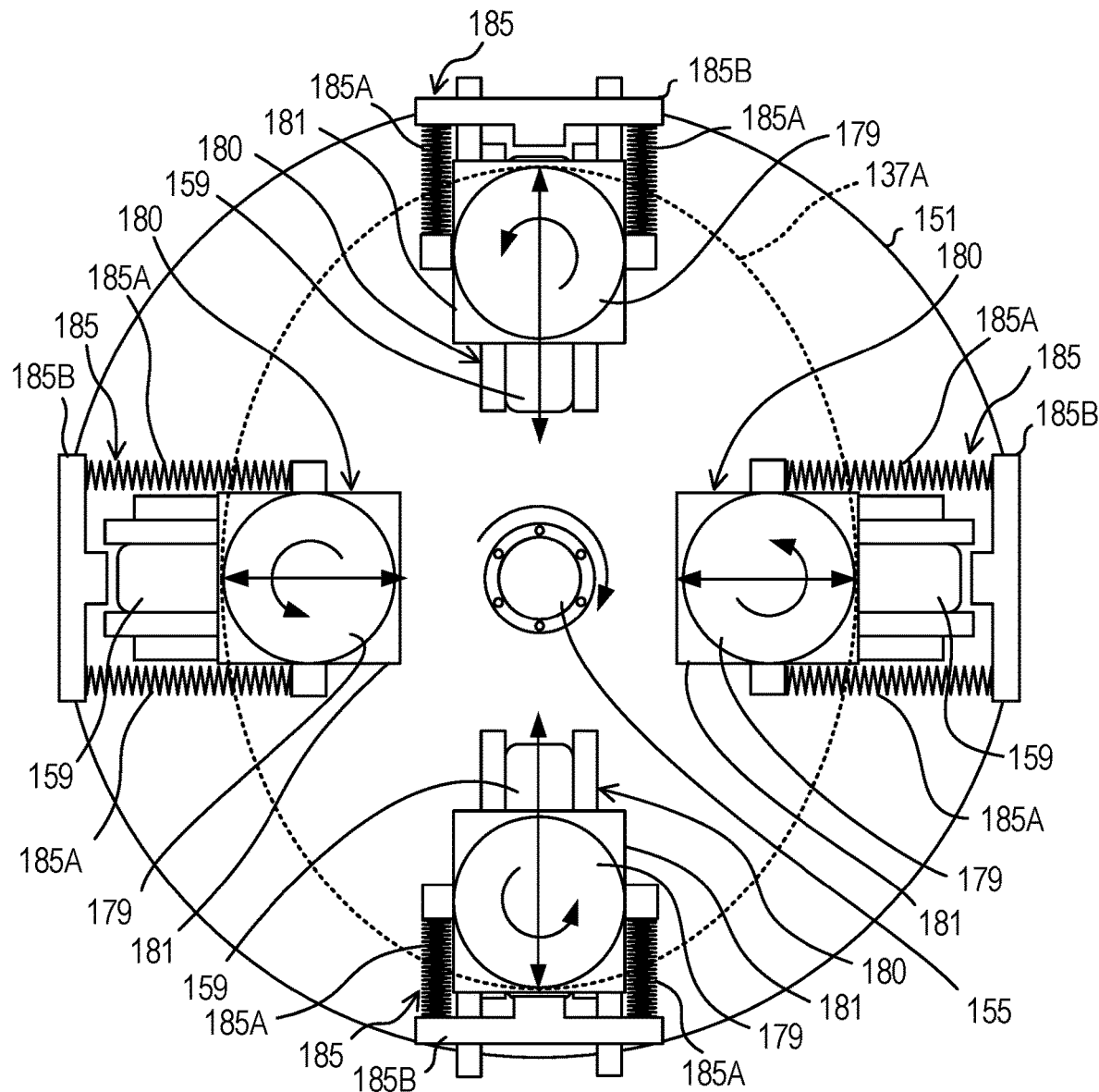
FIG. 5 is a schematic rear view of a main-rotation device, on which an auxiliary rotation device is mounted in some embodiments.

As shown in FIG. 3 and FIG. 4, the guiding device 130 comprises a base plate 131, a guide member 137, and a shaft 135 rotatably held by the base plate 131 via a ball bearing 133.

The guide member 137 comprises a guide rail 137A and a bottom plate 137C having a peripheral edge with the same shaped profile as that of the guide rail 137A. As shown in FIG. 4, the guide rail 137A protrudes from the peripheral edge of the bottom plate 137C.

The bottom plate 137C includes a hole 137D, through which the shaft 135 passes. The guide member 137 is fixed to the base plate 131 via, for example, a screw, with the shaft 135 penetrating the hole 137D.

The guide rail 137A is arranged around the shaft 135 and in a ring shape having no point symmetry, in a state where the guide member 137 is fixed to the base plate 131. In an example shown in FIG. 3, the guide rail 137A has an elliptical profile in a circumferential direction.

The main-rotation device 150 is rotatably held with respect to the guiding device 130. As shown in FIG. 2 and FIG. 4, the main-rotation device 150 comprises a main-rotation plate 151 and a shaft 155. The shaft 155 extends from the center of the main-rotation plate 151 toward the guiding device 130 in a normal direction of the main-rotation plate 151. The shaft 155 is coupled to the main-rotation plate 151, and further to a first end of the shaft 135 of the guiding device 130.

The shaft 135 has a second end protruding through a back surface of the guiding device 130. The second end of the shaft 135 is coupled to the motor 110. The main-rotation device 150 is arranged over the guiding device 130 such that the main-rotation plate 151 receives power from the motor 110 to rotate around the shaft 155.

As shown in FIG. 2, the main-rotation plate 151 comprises long slits 159 radially extending and spaced at intervals of 90 degrees. The number of the auxiliary rotation devices 170 is the same as that of the slits 159. Each of the auxiliary rotation devices 170 penetrates the corresponding one of the slits 159.

As shown in FIG. 2, FIG. 4, FIG. 5, and FIG. 6, each of the auxiliary rotation devices 170 comprises a rotating table 171, a shaft 175, a wheel 179, a single-shaft sliding stage 180, and a spring structure 185. In FIG. 4, the single-shaft sliding stage 180 is arranged in a position corresponding to broken lines. In FIG. 4, details of the single-shaft sliding stage 180 are omitted.

The shaft 175 penetrates the slits 159 and the single-shaft sliding stage 180. The single-shaft sliding stage 180 is provided along the slits 159, and fixed to a back surface of the main-rotation plate 151.

The single-shaft sliding stage 180 movably holds the shaft 175 along the slits 159 in a radial direction of the main-rotation plate 151. The single-shaft sliding stage 180 comprises a stage body 181 including a ball bearing 181A for rotatably holding the shaft 175. The stage body 181 slides along the slits 159 in the radial direction of the main-rotation plate 151.

The first end of the shaft 175 protrudes through a front surface of the main-rotation plate 151. The first end of the shaft 175 is coupled to a center of the rotating table 171 on a back side of the rotating table 171. As a result, the rotating table 171 is arranged on a front side of the main-rotation plate 151 with being rotatable around the shaft 175 and linearly movable in the radial direction of the main-rotation plate 151 in accordance with movement of the shaft 175.

The rotating table 171 has a circular profile, and includes a support structure on its front side for supporting the substrate 200 having a rectangular shape. Specifically, the rotating table 171 has a rectangular recess 171A on the front side. The recess 171A has a shape corresponding to that of the substrate 200, and the rotating table 171 supports the substrate 200 fitted in the recess 171A.

Figure 6:
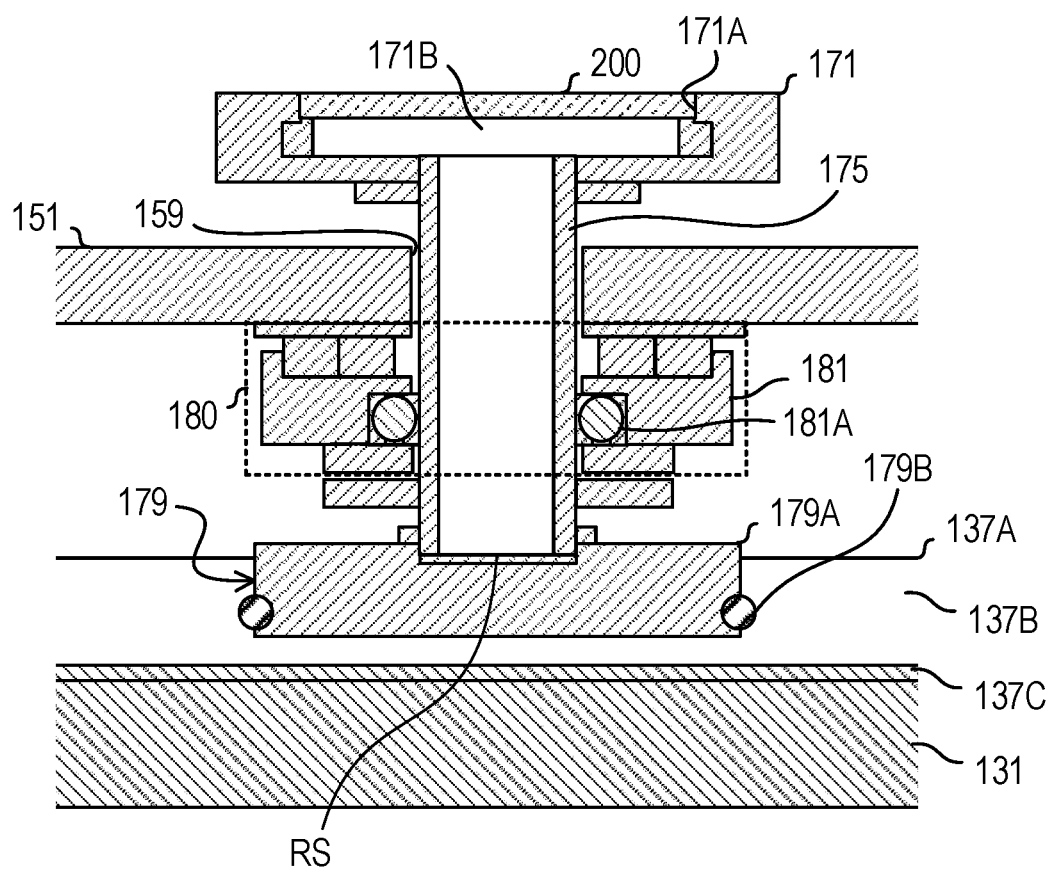
FIG. 6 is a schematic sectional view of the auxiliary rotation device in a cross section orthogonal to a longitudinal direction of a slit in some embodiments.

As shown in FIG. 4 and FIG. 6, the rotating table 171 includes a hollow internal structure, and supports an edge of the substrate 200 from a back side of the substrate 200. The shaft 175 coupled to the rotating table 171 is a hollow cylindrical member. The rotating table 171 has a cavity 171B communicating with the second end of the shaft 175 opposite to the first end thereof.

The second end of the shaft 175 is positioned on a back side of the main-rotation plate 151. The second end of the shaft 175 is provided with a light receiving sensor RS that covers an opening of the shaft 175. The light receiving sensor RS receives a measurement light, which is emitted from above the substrate 200 and propagates through the substrate 200 and the cavity 171B. The light receiving sensor RS outputs a signal corresponding to a light intensity of the received measurement light. The output signal from the light receiving sensor RS is used for measuring a thickness of the thin film formed on the substrate 200.

The second end of the shaft 175 is coupled to a center of the wheel 179. As described above, the rotating table 171 is coupled to the first end of the shaft 175, and the wheel 179 is coupled to the second end of the shaft 175. This causes the rotating table 171 to rotate around the shaft 175 (that is, rotates on its own axis) in accordance with rotation of the wheel 179.

With respect to a configuration of the wheel 179, an O-ring 179B is attached to a side wall of a wheel-body 179A having a circular profile. The wheel 179 is arranged at a height where an inner circumferential surface 137B of the guide rail 137A is in contact with the O-ring 179B, allowing the wheel 179 to travel on the inner circumferential surface 137B of the guide rail 137A.

That is, when the main-rotation plate 151 rotates, the wheel 179 travels on the inner circumferential surface 137B of the guide rail 137A in accordance with a revolving motion of the rotating table 171 generated by rotation of the main-rotation plate 151.

The spring structure 185 is provided to achieve a behavior in which the wheel 179 stably travels on the inner circumferential surface 137B of the guide rail 137A without being separated away and slipping from the inner circumferential surface 137B of the guide rail 137A.

The spring structure 185 comprises two springs 185A, which interpose the slit 159 and are arranged along a longitudinal direction of the slit 159. First ends of the two springs 185A are coupled to a spring-fixing portion 185B on a radially outer side of the main-rotation plate 151 with respect to the slit 159. The spring-fixing portion 185B is fixed to the back surface of the main-rotation plate 151.

Second ends of the two springs 185A opposite to the first ends thereof are coupled to the stage body 181 of the single-shaft sliding stage 180. The spring 185A in the absence of tension is sufficiently shorter in length than that of the slits 159.

Due to the spring structure 185, the wheel 179 receives, from the spring 185A, a tension directing to the radially outer side of the main-rotation plate 151 via the stage body 181 and the shaft 175. This causes the wheel 179 to be pressed against the inner circumferential surface 137B of the guide rail 137A.

That is, the wheel 179 receives, from the spring 185A, a radially outward biasing force, and is pressed against the inner circumferential surface 137B of the guide rail 137A. This causes the wheel 179 to revolve in an orbit along the guide rail 137A while rotating on its own axis, in a state where the wheel 179 is less likely to slip from the inner circumferential surface 137B of the guide rail 137A or to be separated away from the guide rail 137A.

Figure 7A:
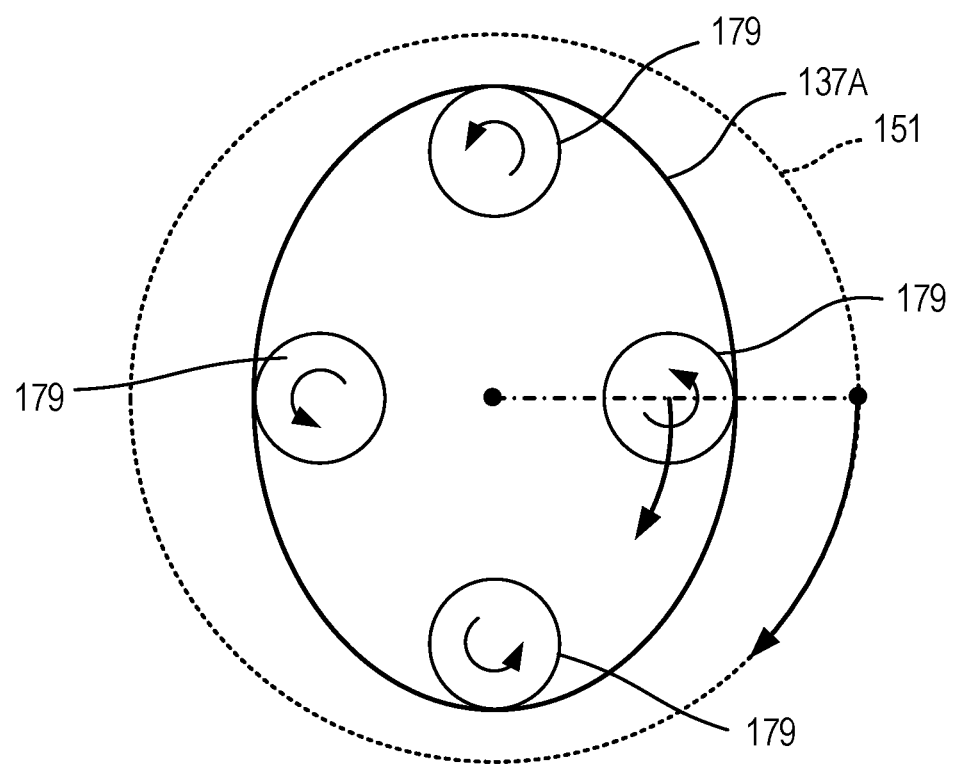
FIG. 7A is a diagram explaining an orbital motion and a rotational motion in some embodiments.
Figure 7B:
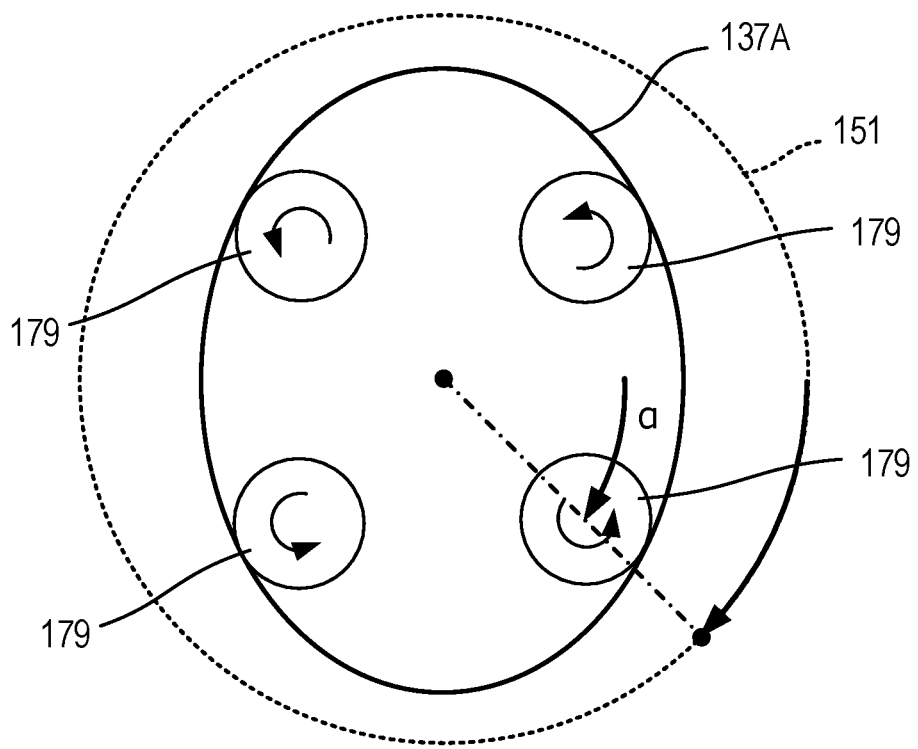
FIG. 7B is a diagram explaining the orbital motion and the rotational motion in some embodiments.

When the guide rail 137A is elliptical as shown in FIG. 3, the wheel 179 of the auxiliary rotation devices 170, and the rotating table 171 in conjunction therewith rotate on their own axes while revolving in an elliptical orbit as shown in FIG. 7A and FIG. 7B. When the main-rotation plate 151 is rotated at an angle α in an arrow direction with the wheel 179 being arranged as shown in FIG. 7A, the wheel 179 moves to a position shown in FIG. 7B such that the wheel 179 traces out the elliptical orbit. In FIG. 7A and FIG. 7B, the main-rotation plate 151 is indicated by broken lines.

In the rotation of the main-rotation plate 151, positions of the rotating table 171 and the wheel 179 in the radial direction of the main-rotation plate 151 are controlled to positions along the guide rail 137A by a centrifugal force, a biasing force due to the spring structure 185, and a dynamic action from the guide rail 137A to the wheel 179 accompanied by drag force. That is, the guide rail 137A controls the positions of the wheel 179 and the shaft 175 in the aforementioned radial direction by contact with the wheel 179 of the auxiliary rotation devices 170, thereby to control the revolving motion of the rotating table 171.

The substrate rotating apparatus 100 in some embodiments controls the revolving orbit using the guide rail 137A, thereby to rotate on its own axis the rotating table 171 supporting the substrate 200 while revolving along the elliptical orbit having no point symmetry. Such revolution and rotation cause complex displacement of all points on the substrate 200 such that the points traverse the non-uniform spatial distribution of the film material from the vapor deposition source 10. This enables the thin film with uniform thickness to be formed on the front surface of the substrate 200.

Figure 8:
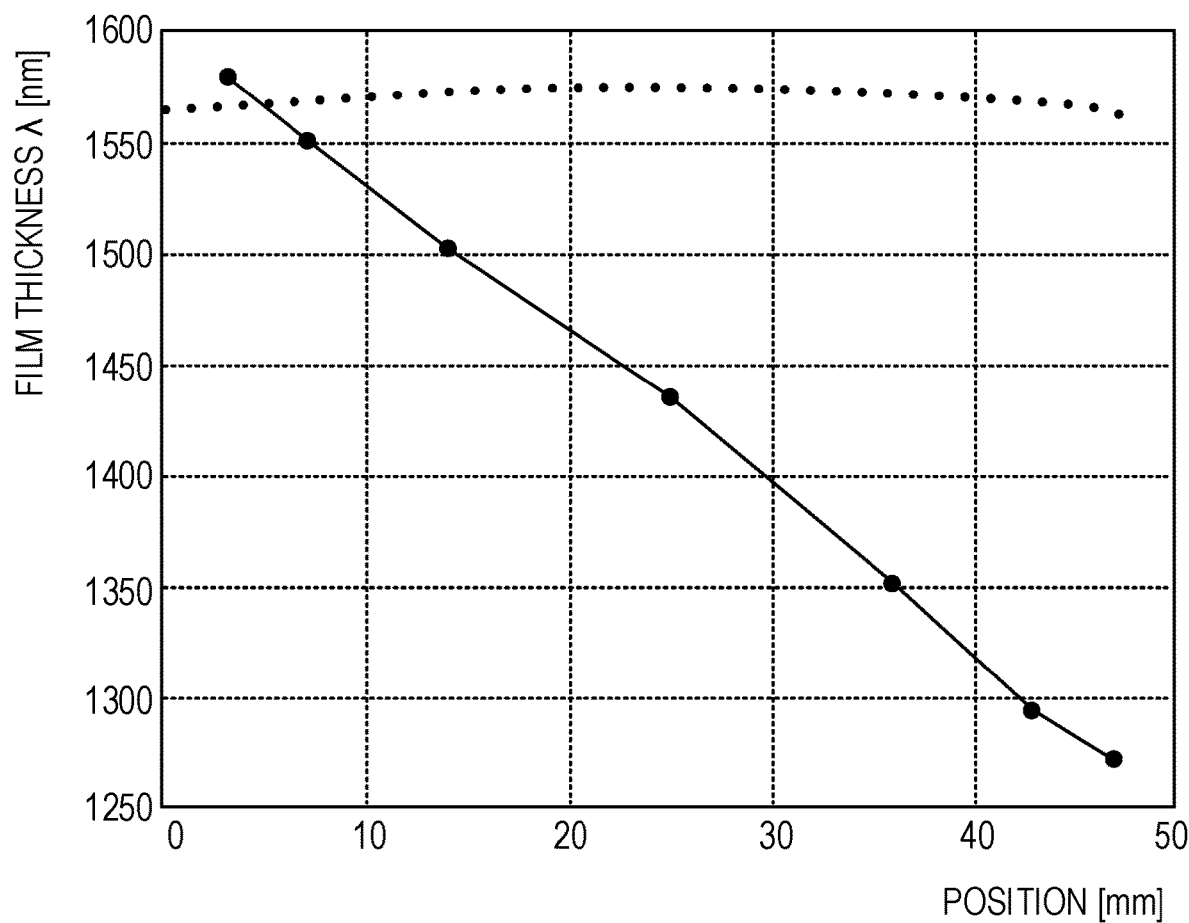
FIG. 8 is a graph showing experimental results regarding a film thickness.

A graph in FIG. 8 shows measurement results for comparison experiment. The measurement results indicate the film thickness λ of the substrate 200 held by the rotating table 171 and the film thickness λ of the substrate 200 held by a substrate holding base, which were measured when the thin film formation was performed while the substrate rotating apparatus 100 was rotated, in a state where the substrate holding base was fixedly provided between two adjacent auxiliary rotation devices 170 on the main-rotation plate 151 so as to be immobile with respect to the main-rotation plate 151.

A horizontal axis in the graph indicates a position of the front surface of the substrate 200. A vertical axis in the graph indicates the film thickness λ of the thin film formed on the front surface of the substrate 200. A solid line in the graph indicates the spatial distribution of the film thickness λ on the substrate 200 mounted on the substrate holding base. Dotted lines in the graph indicates the spatial distribution in the film thickness λ on the substrate 200 mounted on the rotating table 171 in some embodiments. As described above, it can be understood that a thin film with a uniform thickness (λ) can be formed on the substrate 200 with extremely high precision in the substrate rotating apparatus 100 of some embodiments.

As explained above, in the substrate rotating apparatus 100 in some embodiments, the main-rotation device 150 corresponding to a main rotation mechanism rotates around a first rotation shaft (shafts 135, 155).

The rotating table 171, the shaft 175, and the wheel 179 of the auxiliary rotation device 170 corresponding to an auxiliary rotation mechanism revolve about the first rotation shaft (shafts 135, 155) in accordance with rotation of the main-rotation plate 151, and rotate around a second rotation shaft (shaft 175) on its own axis. The rotating table 171, the shaft 175, and the wheel 179 are provided to the main-rotation plate 151.

In the auxiliary rotation device 170, the rotating table 171 comprising a support structure (recess 171A) of the substrate 200 is displaced around the second rotation shaft (shaft 175), and further, the second rotation shaft (shaft 175) is displaced in the radial direction of the main-rotation plate 151.

The guide rail 137A constituting a guide structure has an inner circumferential surface 137B used for controlling a revolving motion of the auxiliary rotation devices 170. The inner circumferential surface 137B extends in the circumferential direction with respect to the first rotation shaft (shafts 135, 155), has a ring-shaped profile having no point symmetry, and faces the first rotation shaft.

The guide rail 137A brings the inner circumferential surface 137B into contact with the wheel 179 of the auxiliary rotation device 170, thereby to regulate displacement of the wheel 179 to the radially outer side of the main-rotation plate 151. This regulation causes the guide rail 137A to control a radial displacement of the second rotation shaft (shaft 175) and the rotating table 171 along the slits 159 such that the auxiliary rotation devices 170 performs the revolving motion in an orbit corresponding to the inner circumferential surface 137B (an orbit along the inner circumferential surface 137B).

As described above, the substrate rotating apparatus 100 in some embodiments employs neither a film thickness correction plate nor a planetary gear mechanism. The substrate rotating apparatus 100 enables the rotating table 171 to perform the revolving motion having no point symmetry while rotating on its own axis. Further, the substrate rotating apparatus 100 causes all points of the substrate 200 to be displaced with respect to the spatial distribution of the film material scattered from the vapor deposition sources 10. Accordingly, as it can be understood from the experimental results as well, the uniform thin film with high precision can be formed on the front surface of the substrate 200.

In the film formation using the planetary gear mechanism, the revolving orbit is perfectly circular. Thus, it is difficult to remove an influence of even function terms of the function T(r), that is, an influence of $r^n$ term with an even order n by making the coefficient closer to zero. On the other hand, the rotating table 171 can be rotated in the elliptical revolving orbit having no point symmetry in some embodiments. The influence of even function terms can be removed, and thus, the film thickness λ with uniformity can be achieved.

Further, in the film formation using the planetary gear mechanism, the revolving orbit is perfectly circular. Thus, when utilizing the two or more vapor deposition sources 10 having different spatial distributions of scattered particles, it has been difficult for all thin films formed by the respective vapor deposition sources 10 to be made uniform. The substrate rotating apparatus 100 in some embodiments can reduce such non-uniformity. That is, the substrate rotating apparatus 100 enables the thin film formed by each of the two or more vapor deposition sources 10 to be more uniform than those of conventional ones.

Furthermore, although vibrations tend to occur during rotation of the planetary gear mechanism, the substrate rotating apparatus 100 in some embodiments can reduce the vibrations during rotation. This vibration reduction contributes to formation of the film thickness with high precision.

In some embodiments, since the revolving orbit is controlled by using the guide rail 137A instead of a gear, a relatively large substrate rotating apparatus 100 can be easily manufactured, and build a system capable of forming a film with uniform thickness on a large substrate 200. As a result, in some embodiments, cost relating to the film formation can be reduced, resulting in increase in productivity.

In some embodiments, by making use of the centrifugal force and the biasing force due to the spring structure 185, the wheel 179 of the auxiliary rotation device 170 is pressed against the inner circumferential surface 137B of the guide rail 137A so as to avoid separating away and slipping from the inner circumferential surface 137B. Further, by making use of rotation of the wheel 179, the rotating table 171 is rotated around the second rotation shaft (shaft 175). This enables the rotational motion of the substrate 200 to be controlled with high precision, and to form the thin film with high precision.

According to some embodiments, various revolving orbits other than the elliptical orbit shown in FIG. 3 can be easily achieved by changes in a circumferential shape of the guide rail 137A. The ellipticity is not limited to the example shown in FIG. 3. For example, the revolving orbit may have any ellipse with an ellipticity a/b of 0.99 or less, where "a" is the shortest distance in the ellipse, and "b" is the longest distance in the ellipse.

Figure 9:
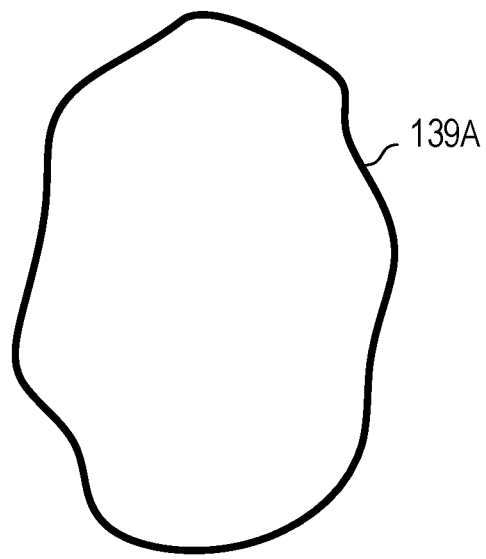
FIG. 9 is a diagram showing a profile of a guide rail in a circumferential direction in some embodiments.

As shown in FIG. 9, the guide rail 137A may be modified to a guide rail 139A having a ring-shaped profile having no point symmetry other than the elliptical profile. The guide rail 139A may be arranged on the base plate 131 so as to meander in the circumferential direction.

More than two guide members 137 with different shapes of the guide rail are prepared, and replacement of these guide members 137 with respect to the base plate 131 allows for significantly various kinds of revolving motions in the substrate rotating apparatus 100.

Figure 10:
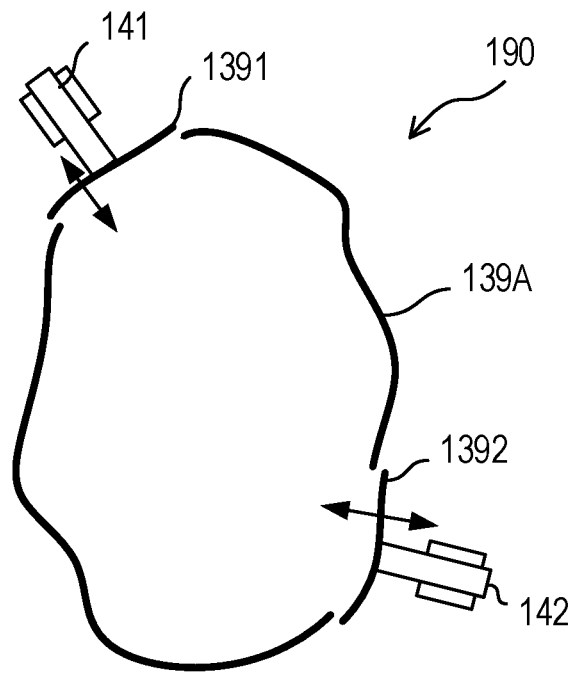
FIG. 10 is a diagram showing a configuration of the guide rail comprising sliding mechanisms in some embodiments.

The substrate rotating apparatus 100 may be provided with a mechanism for moving the guide rails 137A, 139A. As shown in FIG. 10, a substrate rotating apparatus 190 comprises a first sliding mechanism 141 and a second sliding mechanism 142. The first sliding mechanism 141 slides a first portion 1391 of the guide rail 139A in a radial direction with respect to the first rotation shaft. The second sliding mechanism 142 slides a second portion 1392 of the guide rail 139A in the radial direction with respect to the first rotation shaft. The first sliding mechanism 141 and the second sliding mechanism 142 are arranged on the base plate 131 of the guiding device 130. The first portion 1391 and the second portion 1392 of the guide rail 139A are separated away from a bottom plate and other portions of the guide rail 139A.

The substrate rotating apparatus 190 may be configured in a similar manner to the substrate rotating apparatus 100 in the above-described embodiments, except that a portion of the guide rail 139A is configured to be movable and the substrate rotating apparatus 190 comprises first and second sliding mechanisms 141, 142. In the substrate rotating apparatus 190, the revolving orbit of the rotating table 171 is adjustable for a uniform film thickness, thereby to achieve the thin film formation with higher precision.

Examples of the substrate rotating apparatus in some embodiments of the present disclosure have been described above. Nevertheless, the substrate rotating apparatus of the present disclosure is not limited to the aforementioned embodiments and may be modified in various modes.

For example, the spring structure 185 need not be provided in the substrate rotating apparatus. Even without the spring structure 185, the wheel 179 may be sufficiently pressed on the guide rail 137A due to the centrifugal force. In addition, the substrate rotating apparatus 100 shown in the drawings is conceptual, and the dimension and shape of each part of the substrate rotating apparatus 100 are not limited to those illustrated in the drawings.

The functions of one constituent element in the above embodiments may be dispersed as two or more constituent elements. The functions of a two or more constituent elements may be integrated to one constituent element. Further, some configurations of the above embodiment may be omitted. All aspects included in the technical concept identified solely by the expressions recited in claims are embodiments of the present disclosure.

The invention claimed is:

1. A substrate rotating apparatus for film formation, the substrate rotating apparatus comprising:
   a main rotation mechanism rotating around a first rotation shaft;
   an auxiliary rotation mechanism revolving about the first rotation shaft in accordance of rotation of the main rotation mechanism, and rotating on its own axis around a second rotation shaft; and
   a guide structure provided around the first rotation shaft and configured to control a revolving motion of the auxiliary rotation mechanism,
   wherein the main rotation mechanism comprises the auxiliary rotation mechanism,
   wherein the second rotation shaft is displaced in a radial direction with respect to the first rotation shaft,
   wherein the auxiliary rotation mechanism comprises a support structure supporting a substrate as an object of the film formation,
   wherein the support structure rotates around the second rotation shaft,
   wherein the guide structure has a contact surface extending in a circumferential direction with respect to the first rotation shaft on an outer side in the radial direction of the first rotation shaft relative to a revolving orbit of the auxiliary rotation mechanism, the contact surface being arranged in an elliptical shape in the circumferential direction or in a ring shape that does not have point symmetry in the circumferential direction, and
   wherein the contact surface is an inner circumferential surface facing the first rotation shaft included in the guide structure,
   wherein the guide structure is configured to cause the auxiliary rotation mechanism to perform a revolving motion in an orbit along the contact surface by controlling displacement of the auxiliary rotation mechanism to the outer side in the radial direction by means of the contact surface when the contact surface and the auxiliary rotation mechanism are in contact with each other, and
   wherein the auxiliary rotation mechanism travels on the contact surface and thus rotates on its own axis together with the rotation of the support structure.

2. The substrate rotating apparatus according to claim 1, wherein the main rotation mechanism includes a rotation plate rotating around the first rotation shaft, and
   wherein the rotation plate has a slit along the radial direction, the auxiliary rotation mechanism including:
   the second rotation shaft penetrating the slit,
   a rotating table arranged in a first end portion of the second rotation shaft and including the support structure, and
   a wheel arranged in a second end portion opposite to the first end portion and configured to travel on the contact surface,
   wherein, while the wheel travels on the contact surface in accordance with the revolving motion, the wheel and the rotating table that is coupled to the wheel via the second rotation shaft rotate on their own axes.

3. The substrate rotating apparatus according to claim 1, wherein the auxiliary rotation mechanism is coupled to the main rotation mechanism via a spring biasing the auxiliary rotation mechanism in a direction to press on the contact surface.

4. The substrate rotating apparatus according to claim 1, wherein the contact surface is arranged in an elliptical shape in the circumferential direction,
   wherein the auxiliary rotation mechanism performs a revolving motion about the first rotation shaft in an elliptical orbit.

5. The substrate rotating apparatus according to claim 1, wherein the contact surface is arranged in a ring shape that does not have point symmetry in the circumferential direction, and
   wherein the auxiliary rotation mechanism performs a revolving motion about the first rotation shaft in an orbit having no point symmetry.

6. The substrate rotating apparatus according to claim 1, wherein the guide structure comprises a sliding mechanism for moving at least part of the contact surface to the radial direction.

7. The substrate rotating apparatus according to claim 2, wherein the auxiliary rotation mechanism is coupled to the main rotation mechanism via a spring biasing the auxiliary rotation mechanism in a direction to press on the contact surface.

8. The substrate rotating apparatus according to claim 6, wherein the auxiliary rotation mechanism is coupled to the main rotation mechanism via a spring biasing the auxiliary rotation mechanism in a direction to press on the contact surface.

9. The substrate rotating apparatus according to claim 2, wherein the contact surface is arranged in an elliptical shape in the circumferential direction, and
   wherein the auxiliary rotation mechanism performs a revolving motion about the first rotation shaft in an elliptical orbit.

10. The substrate rotating apparatus according to claim 2, wherein the contact surface is arranged in a ring shape that does not have point symmetry in the circumferential direction, and
    wherein the auxiliary rotation mechanism performs a revolving motion about the first rotation shaft in an orbit having no point symmetry.

11. The substrate rotating apparatus according to claim 3, wherein the contact surface is arranged in an elliptical shape in the circumferential direction, and
    wherein the auxiliary rotation mechanism performs a revolving motion about the first rotation shaft in an elliptical orbit.

12. The substrate rotating apparatus according to claim 3, wherein the contact surface is arranged in a ring shape that does not have point symmetry in the circumferential direction, and wherein the auxiliary rotation mechanism performs a revolving motion about the first rotation shaft in an orbit having no point symmetry.

13. The substrate rotating apparatus according to claim 6, wherein the contact surface is arranged in an elliptical shape in the circumferential direction, and
wherein the auxiliary rotation mechanism performs a revolving motion about the first rotation shaft in an elliptical orbit.

14. The substrate rotating apparatus according to claim 6, wherein the contact surface is arranged in a ring shape that does not have point symmetry in the circumferential direction, and
wherein the auxiliary rotation mechanism performs a revolving motion about the first rotation shaft in an orbit having no point symmetry.

15. The substrate rotating apparatus according to claim 2, wherein the guide structure comprises a sliding mechanism for moving at least part of the contact surface to the radial direction.

16. The substrate rotating apparatus according to claim 1, wherein the contact surface is a flat surface without teeth,
wherein the auxiliary rotation mechanism includes a wheel that is configured to travel on the contact surface,
wherein the wheel and the supporting structure are coupled to the second rotation shaft,
wherein, while the wheel travels on the contact surface in accordance with the revolving motion, the supporting structure that is coupled to the wheel via the second rotation shaft rotates on its own axis in conjunction with rotation of the wheel.

* * * * *